US008102673B2

(12) United States Patent
Chen

(10) Patent No.: US 8,102,673 B2

(45) Date of Patent: Jan. 24, 2012

(54) ELECTRICAL CONNECTOR HAVING HEIGHT-ADJUSTABLE MEMBER

(75) Inventor: De-Jin Chen, Shenzhen (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 323 days.

(21) Appl. No.: 12/469,707

(22) Filed: May 21, 2009

(65) Prior Publication Data

US 2009/0290321 A1 Nov. 26, 2009

(30) Foreign Application Priority Data

May 21, 2008 (CN) .......................... 2008 2 0300805

(51) Int. Cl.
*H05K 7/02* (2006.01)
*H05K 7/04* (2006.01)

(52) U.S. Cl. ......................... 361/807; 361/809; 361/810

(58) Field of Classification Search .................. 361/760, 361/807–810, 720, 736, 748; 439/55, 78–79, 439/81–83, 259, 296, 345, 350, 389, 391, 439/395, 397–398, 404, 492, 493, 499, 586, 439/595, 625, 626, 629–630, 634, 636–637, 439/666, 676, 682

See application file for complete search history.

(56) References Cited

U.S. PATENT DOCUMENTS

| | | | | |
|---|---|---|---|---|
| 5,903,439 | A * | 5/1999 | Tamarkin | 361/742 |
| 6,022,227 | A * | 2/2000 | Huang | 439/79 |
| 6,304,450 | B1 * | 10/2001 | Dibene et al. | 361/704 |
| 7,331,818 | B2 | 2/2008 | Wu et al. | |
| 7,517,232 | B2 * | 4/2009 | Yuan et al. | 439/79 |
| 7,619,899 | B2 * | 11/2009 | Rubenstein et al. | 361/740 |

* cited by examiner

*Primary Examiner* — Hung S Bui

(74) *Attorney, Agent, or Firm* — Wei Te Chung; Andrew C. Cheng; Ming Chieh Chang

(57) ABSTRACT

An electrical connector comprises an insulative housing, a plurality of terminals and a rigid height-adjustable member. The insulative housing defines a mating face, a back face, at least a lengthwise slot on the mating face, and a plurality of passageways extending through the housing from the mating face to the back face. Each of the terminals received in the respective passageways of the insulative housing comprises a contact portion extending into the slot, a retention portion secured in a corresponding passageway of the insulative housing, a mounting end, an S-shaped bellowed portion between said retention portion and the mounting end and configured to extend out of the back face of the insulative housing. The rigid height-adjustable member is supportably mounted onto the housing to lift up the housing to a predetermined height.

17 Claims, 5 Drawing Sheets

ELECTRICAL CONNECTOR HAVING HEIGHT-ADJUSTABLE MEMBER

BACKGROUND OF THE INVENTION

1. Field of the Invention

The present invention relates to an electrical connection device, and more particularly to an electrical connector for mounting on a printed circuit board and having a height-adjustable member configured to lift the connector up to a height with respect to the printed circuit board.

2. Description of Related Art

An electrical connector, such as an electrical connector meeting the Serial ATA (Advanced Technology attachment) specification, is adapted to hard disk. There is a plug connector defining a mating tongue mounted on a printed circuit board in the hard disk and a receptacle connector defining a mating port mounted on the mother board. The hard disk is electrically connected to the mother board when the plug connector is engaged with the receptacle connector. Thus, the mating tongue of the plug connector and the mating port of the receptacle should be at the same level so that the plug connector is engaged with the receptacle connector.

U.S. Pat. No. 7,331,818 issued to WU et al on Feb. 19, 2008, discloses that a receptacle connector defining a mating port includes an elongated insulative housing, a plurality of terminals, a pair of fastening members and a pair of reinforcing elements. The plurality of terminals is held in the insulative housing with lower portions soldered to a printed circuit board. The pair of fastening members is located around opposite ends of the insulative housing for securing the insulative housing to the printed circuit board. The reinforcing element includes a first portion attached to the insulative housing, and a second portion solderable to the printed circuit board at a mounting surface. A corresponding receptacle connector, which is mounted onto the mother board, has to be changed when the plug connector is located on a printed circuit board in the hard disk at different heights. Thus the production cost is considerably expensive.

Hence, an improved electrical connector is required to overcome the disadvantages of the prior art.

SUMMARY OF THE INVENTION

Accordingly, an object of the present invention is to provide an electrical connector with an improved structure to lift up the housing to a predetermined height when necessary.

In order to achieve the above-mentioned object, an electrical connector for mounting onto a printed circuit board comprises an insulative housing, a plurality of terminals and a rigid height-adjustable member. The insulative housing defines a mating face, a back face opposite to the mating face, at least a lengthwise slot on the mating face, and a plurality of passageways extending through the housing from the mating face to the back face, the passageways being in communication with said lengthwise slot. Each of the terminals received in the respective passageways of the insulative housing comprises a contact portion extending into the slot, a retention portion secured in a corresponding passageway of the insulative housing, a mounting end, a bellowed portion between said retention portion and the mounting end and configured to extend out of the back face of the insulative housing. The rigid height-adjustable member is supportably mounted onto the housing to lift up the housing to a predetermined height.

Other objects, advantages and novel features of the present invention will become more apparent from the following detailed description of the present embodiment when taken in conjunction with the accompanying drawings.

DETAILED DESCRIPTION OF THE INVENTION

Figure 1:
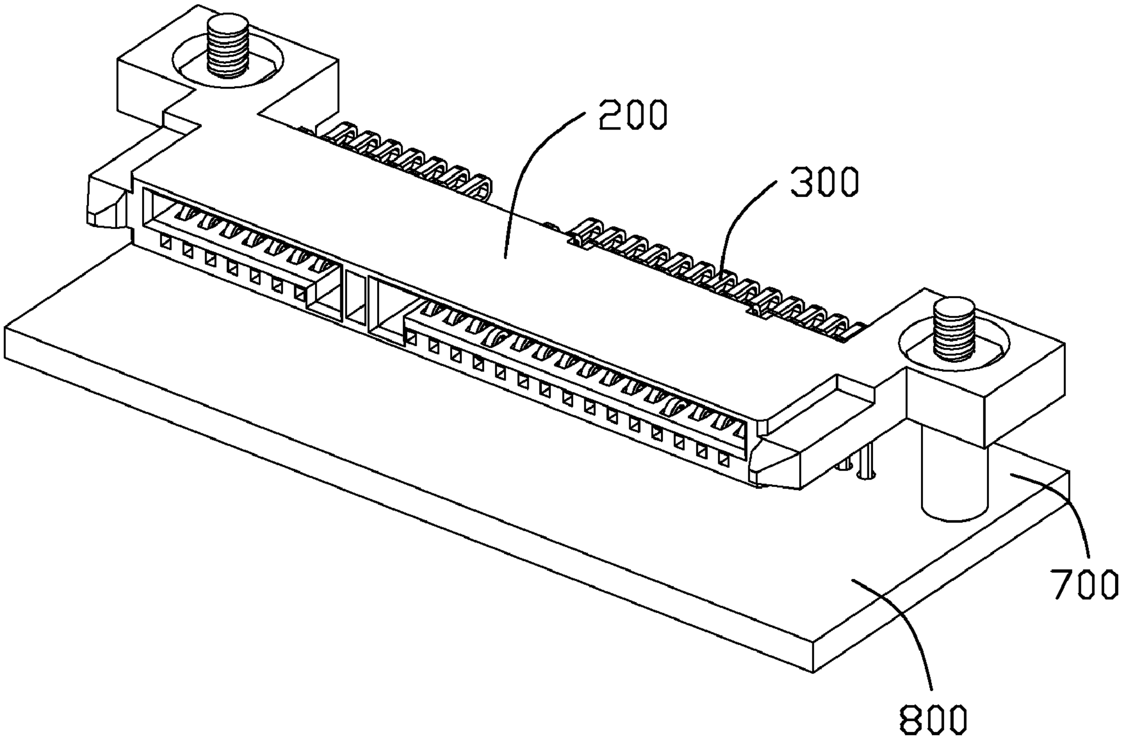
FIG. 1 is an assembled, perspective view of an electrical connector according to an embodiment of the present invention.
Figure 2:
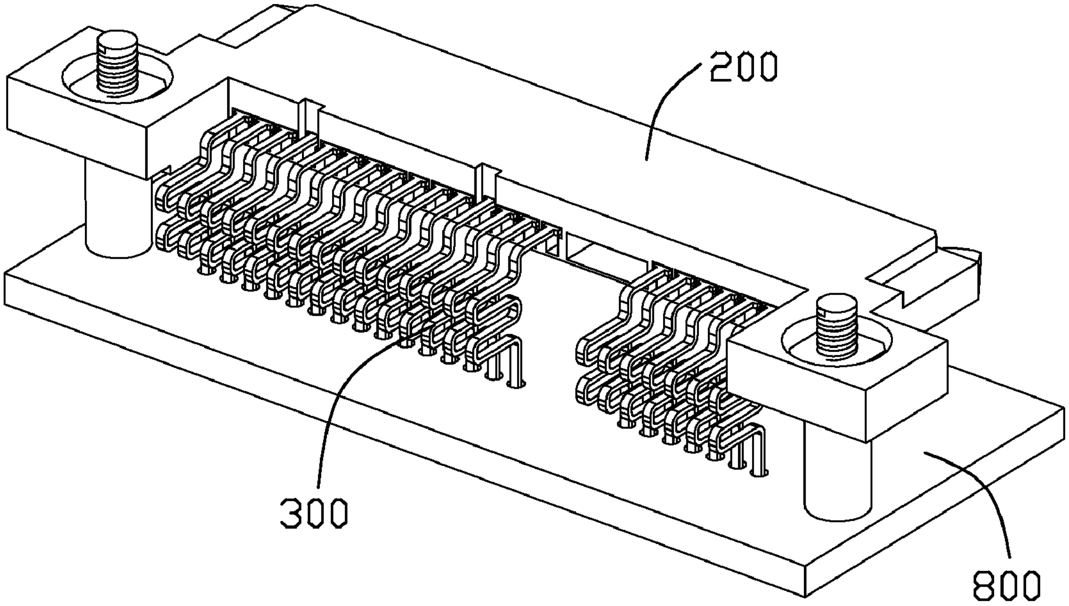
FIG. 2 is another perspective view of the electrical connector of FIG. 1.
Figure 3:
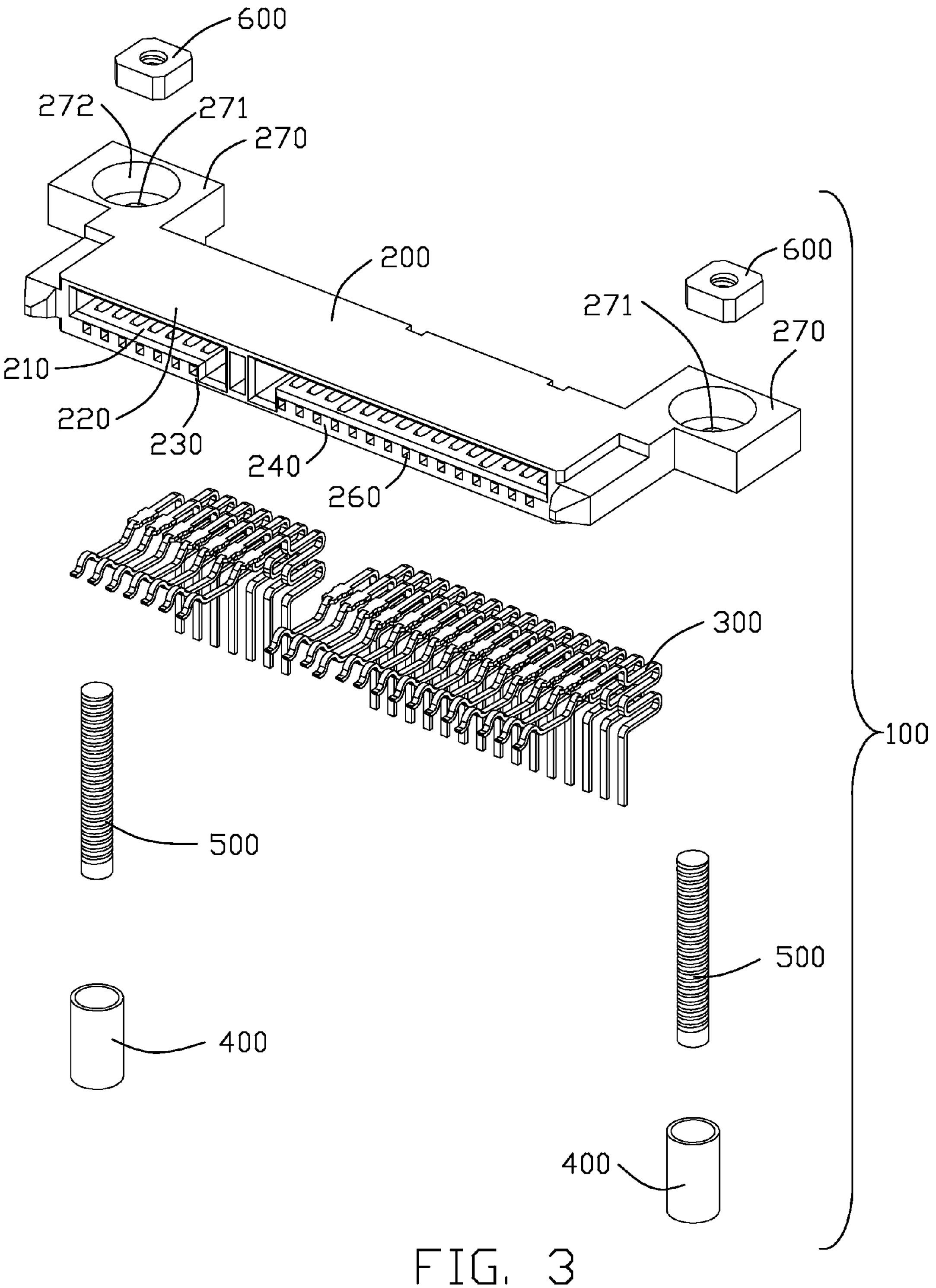
FIG. 3 is an exploded, perspective view of the electrical connector of FIG. 1.
Figure 4:
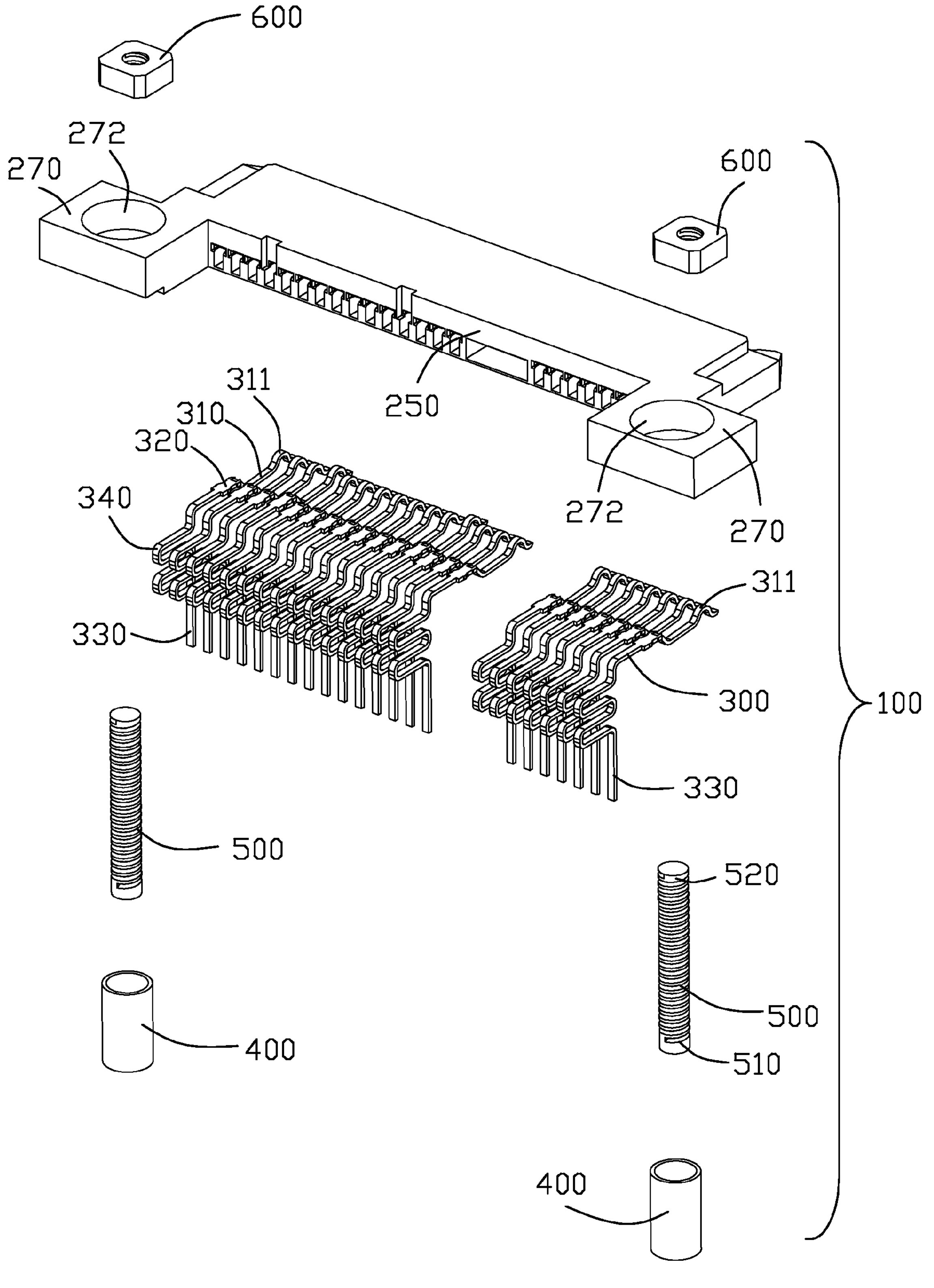
FIG. 4 is another perspective view of the electrical connector of FIG. 3.
Figure 5:
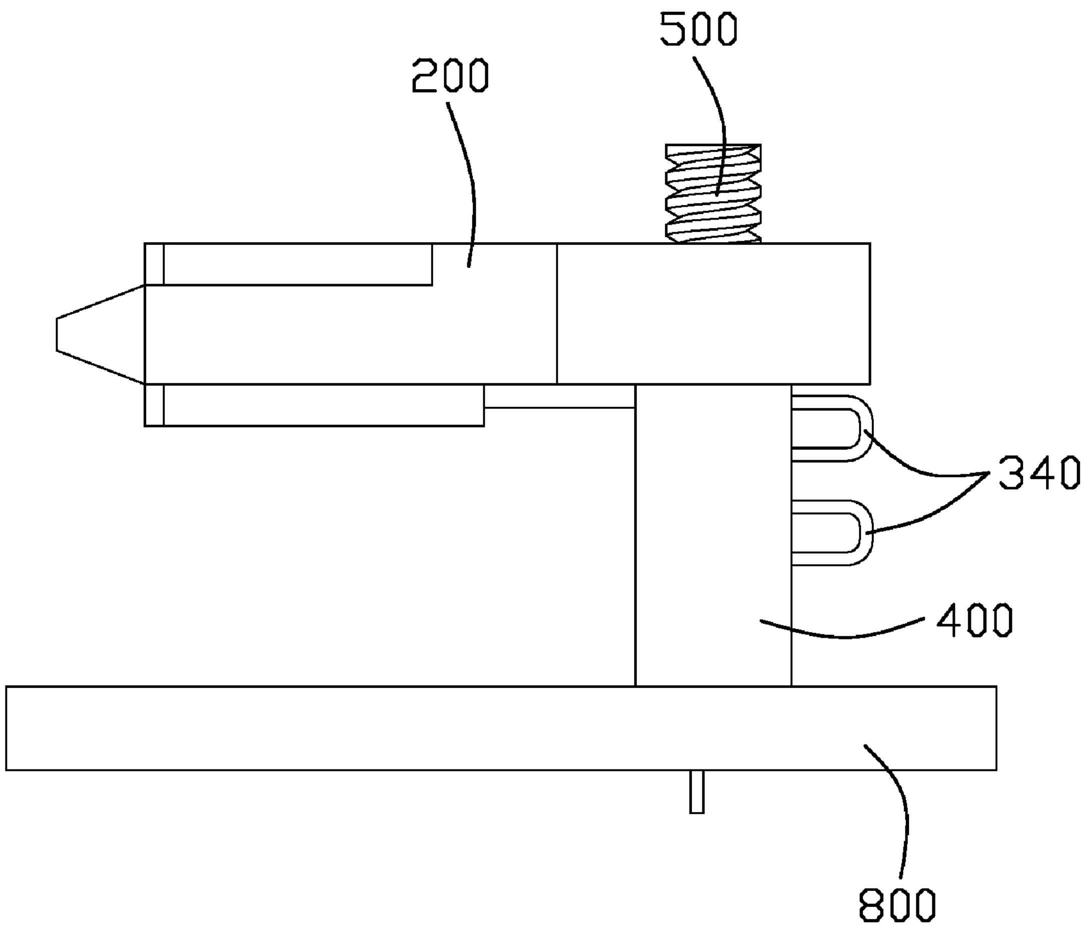
FIG. 5 is a side view of the electrical connector of FIG. 1.

Referring to FIG. 1 to 5, an electrical connector 100 for mounting onto a printed circuit board 800 comprises an insulative housing 200, a plurality of terminals 300 assembled in the housing 200 and a rigid height-adjustable member 700.

The insulative housing 200 defines a top wall 220, a bottom wall 230, a mating face 240, a back face 250 opposite to the mating face 240, a pair of lengthwise slots 210 on the mating face 240 and a plurality of passageways 260 which extend through the housing 200 from the mating face 240 to the back face 250. The passageways 260 are in communication with said lengthwise slots 210. A pair of supporting portions 270 extend from the back face 250 of the insulative housing 200, a pair of holes 271 are located in the supporting portions 270.

Each of the terminals 300 received in the respective passageways 260 of the insulative housing 200 comprises a contact portion 311 extending into the slot 210, a retention portion 320 secured in a corresponding passageway 260 of the insulative housing 200, a mounting end 330, a bellowed portion 340 between the retention portion 320 and the mounting end 330 and configured to extend out of the back face 250 of the insulative housing 200.

The rigid height-adjustable member 700 is supportably mounted onto the housing 200 to lift up the housing 200 to a predetermined height. The rigid height-adjustable member 700 comprises a pair of bolts 500, two sleeves 400 are enveloped onto the bolts 500 respectively. Each bolt 500 comprises an end 510 mounting onto the printed circuit board 800 and an opposite end 520 penetrating through holes 271 of the insulative housing 200. A pair of nuts 600 are screwed onto the opposite end 520 of bolts 500 and received in corresponding recesses 272 of housing 200, each nut 600 abuts against the insulative housing 200, the sleeves 400 which are in the form of a cylindrical tube are located between the printed circuit board 800 and the insulative housing 200, the bellowed portion 340 of each terminal 300 lengthens and shortens with the different height of the sleeves 400.

When assembling, the pair of bolts 500 is soldered onto a printed circuit board 800. Secondly, two sleeves 400 are enveloped onto the bolts 500 respectively and located on the printed circuit board 800. Thirdly, the insulative housing 200 is mounted onto the bolts 500, the nuts 500 are screwed onto the opposite end 520 of bolts 500 and received in corresponding recesses 272 of housing 200, while the mounting end 330 of each terminal 300 penetrates holes of the printed circuit board 800.

When the higher or lower sleeves are enveloped onto the bolts 500, the bellowed portion 340 of terminals 300 lengthen or shorten accordingly, and the insulative housing 200 is lifted up to a predetermined level.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An electrical connector for mounting onto a printed circuit board, comprising:

an insulative housing defining a mating face, a back face opposite to the mating face, at least one lengthwise slot on the mating face, and a plurality of passageways extending through the housing from the mating face to the back face, the passageways being in communication with said lengthwise slot;

a plurality of terminals received in the respective passageways of the insulative housing, each terminal comprising a contact portion extending into the slot, a retention portion secured in a corresponding passageway of the insulative housing, a mounting end, a bellowed portion between said retention portion and the mounting end and configured to extend out of the back face of the insulative housing;

a pair of bolts extending through opposite ends of the housing and secured with a pair of nuts at the insulative housing respectively; and two separated sleeves, each sleeve enveloping the corresponding bolts respectively;

wherein the sleeves are sandwiched between a bottom of the insulative housing and the printed circuit board in a condition that a height of the insulative housing distant to the printed circuit board is changed by replacing the sleeves.

2. The electrical connector as claimed in claim 1, wherein the sleeves have a diameter larger than that of the bolts so that the bolts are inserted in the sleeves easily.

3. The electrical connector as claimed in claim 1, wherein a pair of supporting portions each extends from the back face of the insulative housing, a pair of holes each is located in a corresponding supporting portion, two ends of bolts penetrate through holes respectively.

4. The electrical connector as claimed in claim 1, wherein the bellowed portion comprises two lying U-shaped portions.

5. The electrical connector as claimed in claim 3, wherein the pair of nuts is received in recesses at a top face of the supporting portions respectively.

6. The electrical connector as claimed in claim 1, wherein the two U-shaped portions are located below a bottom of the housing and between the pair of sleeves.

7. An electrical connector assembly comprising:

a printed circuit board;

an insulative housing defining a horizontal mating port parallel to the printed circuit board;

a plurality of contacts disposed in the housing with mating sections exposed in the mating port, horizontal retaining sections behind the mating sections, and vertical mounting sections mounted to the printed circuit board and being compressible or extendable along at least a vertical direction;

a pair of height-adjustable members positioned upon the printed circuit board, said pair of height-adjustable members being respectively located under and supporting two opposite ends of the housing; wherein said mounting section defines a serpentine shape thereof, and two opposite ends of said serpentine shape are connected to two corresponding upright sections, respectively.

8. The electrical connector assembly as claimed in claim 7, wherein said height-adjustable member includes a screw which is rotatable relative to the printed circuit board.

9. The electrical connector assembly as claimed in claim 8, wherein said screw is not moved axially relative to the printed circuit board in a direction perpendicular to said printed circuit board.

10. The electrical connector assembly as claimed in claim 8, wherein said housing is equipped with a pair of nuts to cooperate with the corresponding screws so as to move up and down the housing during rotation of the screw.

11. The electrical connector assembly as claimed in claim 10, wherein said nuts are received in corresponding cavities in the corresponding ends of the housing, respectively.

12. The electrical connector assembly as claimed in claim 7, wherein the whole housing extends in a coplanar flat manner.

13. The electrical connector assembly as claimed in claim 7, wherein said serpentine shape includes a complete S-shaped section thereof.

14. The electrical connector assembly as claimed in claim 7, wherein the pair of height-adjustable members are discrete from each other without any linkage therebetween.

15. An electrical connector assembly, comprising:

a printed circuit board (PCB) mounted with an electrical connector with a predetermined vertical height from the PCB;

the electrical connector comprising:

a pair of bolts therewith bottom ends soldered to the PCB;

a pair of separated sleeves with said predetermined height, the sleeves being enveloped onto the bolts from top ends of the bolts;

an insulative housing loaded with a plurality of terminals and defining a mating portion and a pair of supporting portions integrally extending rearwards from the mating portion, the terminals comprising contacting portions in the mating portion, mounting portions connecting with the PCB and bellowed portions located in a space between the supporting portions, the supporting portions defining holes, the insulative housing being located on the sleeves by the bolts being received in the holes and riveting with two nuts.

16. The electrical connector assembly as claimed in claim 15, wherein the sleeves have a diameter larger than the bolts so that the bolts are inserted in the sleeves easily.

17. The electrical connector assembly as claimed in claim 15, the mating portion and the supporting portion are located at a substantially same plane.

* * * * *